US012174264B2

(12) United States Patent
He et al.

(10) Patent No.: US 12,174,264 B2
(45) Date of Patent: Dec. 24, 2024

(54) METHOD FOR DETECTING INCONSISTENCY OF SINGLE CELLS IN VEHICLE BATTERY, DEVICE AND MEDIUM

(71) Applicants: CHINA AUTOMOTIVE TECHNOLOGY AND RESEARCH CENTER CO., LTD., Tianjin (CN); AUTOMOTIVE DATA OF CHINA (TIANJIN) CO., LTD., Tianjin (CN); AUTOMOTIVE DATA OF CHINA CO., LTD., Beijing (CN)

(72) Inventors: Shaoqing He, Tianjin (CN); Fang Wang, Tianjin (CN); Peng Zhang, Tianjin (CN); Xiongbo Hao, Tianjin (CN); Juntong Cai, Tianjin (CN); Nanlin Lei, Tianjin (CN); Chunhui Wang, Tianjin (CN); Qingkun Hou, Tianjin (CN)

(73) Assignees: CHINA AUTOMOTIVE TECHNOLOGY AND RESEARCH CENTER CO., LTD., Tianjin (CN); AUTOMOTIVE DATA OF CHINA (TIANJIN) CO., LTD., Tianjin (CN); AUTOMOTIVE DATA OF CHINA CO., LTD., Beijing (CN)

( * ) Notice: Subject to any disclaimer, the term of this patent is extended or adjusted under 35 U.S.C. 154(b) by 0 days.

(21) Appl. No.: 18/397,957

(22) Filed: Dec. 27, 2023

(65) Prior Publication Data

US 2024/0319288 A1 Sep. 26, 2024

(30) Foreign Application Priority Data

Mar. 24, 2023 (CN) .......................... 202310293013.1

(51) Int. Cl.
*G01R 31/396* (2019.01)
*G01R 31/36* (2020.01)
(Continued)

(52) U.S. Cl.
CPC ....... *G01R 31/396* (2019.01); *G01R 31/3646* (2019.01); *G01R 31/3648* (2013.01);
(Continued)

(58) Field of Classification Search
CPC .............. G01R 31/396; G01R 31/3646; G01R 31/3648; G01R 31/388; H01M 10/4285; H01M 2220/20
See application file for complete search history.

(56) References Cited

U.S. PATENT DOCUMENTS

2021/0218257 A1* 7/2021 Wu ........................ H01M 10/44
2023/0084779 A1* 3/2023 Sun ........................ G01R 31/382
                                                                 320/118
2023/0236264 A1* 7/2023 Wu ..................... G01R 31/3842
                                                                   702/63

FOREIGN PATENT DOCUMENTS

CN          103081212 A    *   5/2013          G01R 31/3634
CN          104183878 A      12/2014
(Continued)

OTHER PUBLICATIONS

First Office Action issued in counterpart Chinese Patent Application No. 202310293013.1, dated May 6, 2023.
(Continued)

*Primary Examiner* — Mi'schita' Henson
(74) *Attorney, Agent, or Firm* — Westbridge IP LLC

(57) ABSTRACT

Disclosed are a method and a device for detecting inconsistency of single cells in vehicle battery, and a medium. The method includes obtaining current battery data for a vehicle under test, determining whether the current battery data corresponds to a charging or discharging condition, and separately evaluating the presence of inconsistency in cells under each condition. This enables distinct detection for charging and discharging conditions, thereby enhancing detection accuracy.

8 Claims, 4 Drawing Sheets

(51) Int. Cl.
*G01R 31/388* (2019.01)
*H01M 10/42* (2006.01)

(52) U.S. Cl.
CPC ...... *G01R 31/388* (2019.01); *H01M 10/4285* (2013.01); *H01M 2220/20* (2013.01)

(56) References Cited

FOREIGN PATENT DOCUMENTS

| | | | | | |
|---|---|---|---|---|---|
| CN | 107085187 | A | | 8/2017 | |
| CN | 114247663 | A | | 3/2022 | |
| CN | 114879066 | A | | 8/2022 | |
| CN | 115616410 | A | | 1/2023 | |
| CN | 115648944 | A | | 1/2023 | |
| CN | 114050633 | B | * | 11/2023 | ........... G01R 31/374 |
| FR | 2961351 | A1 | | 12/2011 | |
| JP | 2013213684 | A | * | 10/2013 | |
| TW | I773306 | B | | 8/2022 | |
| WO | WO-2021259196 | A1 | * | 12/2021 | ........... G01R 31/385 |
| WO | WO-2022134988 | A1 | * | 6/2022 | |
| WO | WO-2022174679 | A1 | * | 8/2022 | .............. B60L 58/10 |

OTHER PUBLICATIONS

Li et al., Research on Consistency Maintenance Method of Battery Energy Storage System with Hierarchical Utilization, Sino-Global Energy, 2017, 22(4), pp. 89-96, dated Apr. 15, 2017.
Zhang et al., Analysis and modeling of nonuniformity characteristics of tractive Li-ion batteries, Chinese Battery Industry, 2008, 13(2), pp. 103-108, dated Apr. 25, 2008.

* cited by examiner

METHOD FOR DETECTING INCONSISTENCY OF SINGLE CELLS IN VEHICLE BATTERY, DEVICE AND MEDIUM

CROSS-REFERENCE TO RELATED APPLICATIONS

This application claims priority to China Patent Application No. 202310293013.1, titled "METHOD FOR DETECTING INCONSISTENCY OF SINGLE CELLS IN VEHICLE BATTERY, DEVICE AND MEDIUM", filed Mar. 24, 2023 in the China National Intellectual Property Administration (CNIPA), the entire contents of which is hereby incorporated by reference in its entirety.

TECHNICAL FIELD

The present disclosure relates to the field of electrical variable measurement technology, particularly to a method and a device for detecting inconsistency of single cells in vehicle battery, and a medium.

BACKGROUND

Ensuring the safety of new energy vehicles has always been a focal point of traffic safety concerns and a primary responsibility in the vehicle development efforts of numerous automotive enterprises. The spontaneous thermal runaway of new energy vehicles is a crucial aspect of vehicle safety, with the inconsistency in single cells being a primary cause leading to thermal runaway.

However, current algorithms for identifying inconsistency of single cells in a vehicle battery suffer from low accuracy and high computational demands.

In light of this, the present disclosure is introduced.

SUMMARY

To address the aforementioned issues, the present disclosure provides a method for detecting inconsistency of single cells in a vehicle battery, aiming to achieve accurate detection of cell inconsistency while addressing the low accuracy and high computational demands in the prior art.

Embodiments of the present disclosure provides a method for detecting inconsistency of single cells in a vehicle battery, including the following steps:
  obtaining current battery data corresponding to a to-be-tested vehicle, where the current battery data includes charge-discharge status, single cell voltages, battery current, and state of charge;
  if the current battery data is determined to correspond to a charging condition based on the charge-discharge status, using a first warning model corresponding to the charging condition to extract target analysis data from the current battery data based on the state of charge at various time points: determining whether the cell inconsistency exists in the to-be-tested vehicle or not by a current mean voltage drop among the single cells corresponding to the target analysis data.

If the current battery data is determined to correspond to a discharging condition based on the charge-discharge status, using a second warning model corresponding to the discharging condition to extract target analysis data from the current battery data based on the battery current and state of charge at various time points: determining whether the cell inconsistency exists in the to-be-tested vehicle or not by a current voltage differential between single cells at adjacent time points corresponding to the target analysis data.

Embodiments of the present disclosure provides an electronic device, the electronic device including: a processor and a memory. The processor, by invoking a program or instruction stored in the memory, is configured to execute the steps of the method for detecting inconsistency of single cells of a vehicle battery according to any one of the embodiments.

Embodiments of the present disclosure provides a computer-readable storage medium, storing a program or instruction, where the program or instruction causes a computer to execute the steps of the method for detecting inconsistency of single cells in a vehicle battery according to any one of the embodiments.

Embodiments of the present disclosure have the following advantages.

Obtaining current battery data corresponding to the to-be-tested vehicle, determining whether the current battery data corresponds to a charging condition based on the charge-discharge status in the current battery data. If so, using the first warning model corresponding to the charging condition, extracting target analysis data from the current battery data based on the state of charge at various time points. Subsequently, assessing the inconsistency in single cells by determining the current mean voltage drop among the single cells corresponding to the target analysis data. If not, using the second warning model corresponding to the discharging condition, extracting target analysis data from the current battery data based on the battery current and state of charge at various time points. Subsequently, assessing the inconsistency in single cells by determining the current voltage differential between single cells at adjacent time points corresponding to the target analysis data. This distinguishes between charging and discharging conditions, proposing different warning models for each condition, thereby enhancing the accuracy of cell inconsistency warning detection. This resolves the issue of low detection accuracy in the prior art. Additionally, under charging and discharging conditions, extracting partial data from the current battery data as target analysis data for subsequent detection reduces the required data volume, thereby reducing computational demands during the detection process and improving efficiency. This addresses the problem of high computational demands in the prior art.

BRIEF DESCRIPTION OF THE DRAWINGS

In order to elucidate specific embodiments of the present disclosure or technical solutions in the prior art more clearly, a brief introduction to the drawings to be used in specific embodiments or the description of the prior art will be provided below. It is evident that the drawings in the description below are some embodiments of the present disclosure. Ordinary skilled artisans in the field can obtain additional drawings based on these drawings without exercising creative labor.

DETAILED DESCRIPTION OF THE DISCLOSURE

To provide a clear, comprehensive description of the technical solutions of the present disclosure, its objectives, technical solutions, and advantages will be described in detail. It is apparent that the described embodiments are only part of the embodiments of the present disclosure, not all embodiments. Based on the embodiments disclosed in the present disclosure, all other embodiments obtained by ordinary skilled artisans in the field without creative labor are within the scope of protection of the present disclosure.

One embodiment of the present disclosure provides a method for detecting inconsistency in single cells of a vehicle battery, primarily applicable to platforms, servers, or cloud systems that determine whether a vehicle has inconsistency in single cells based on the received current battery data of a new energy vehicle and issue timely warnings for cell inconsistency. The method may be executed by electronic devices integrated into on-board, server, cloud, or platform devices.

Figure 1:
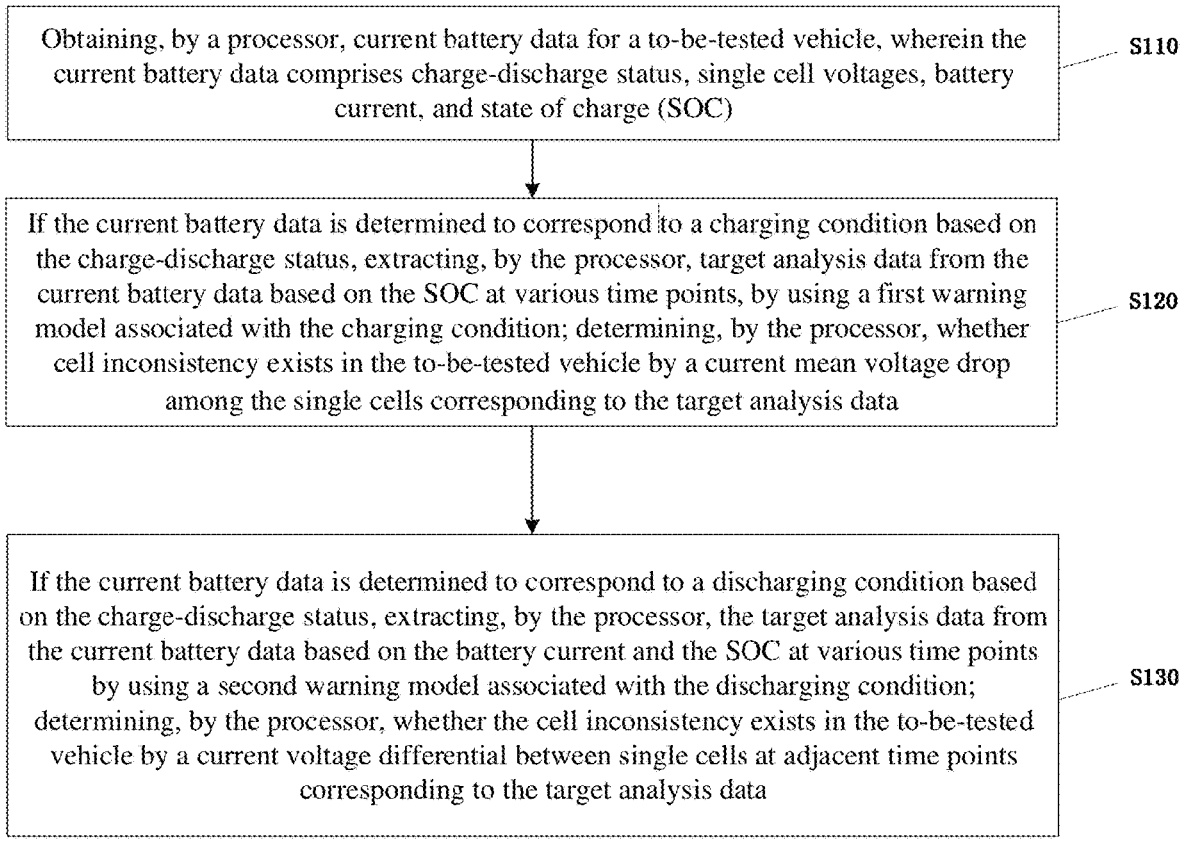
FIG. 1 is a flowchart of a method for detecting inconsistency of single cells in a vehicle battery according to embodiments of the present disclosure.

FIG. 1 is a flowchart of a method for detecting inconsistency in single cells of the vehicle battery according to embodiment of the present disclosure. Referring to FIG. 1, the method for detecting inconsistency in single cells of the vehicle battery includes:

S110: obtaining current battery data for a to-be-tested vehicle, where the current battery data comprises charge-discharge status, single cell voltages, battery current, and state of charge (SOC).

The to-be-tested vehicle may be a vehicle currently being identified for the presence of inconsistency in single cells. Specifically, the platform can receive real-time current battery data sent by various to-be-tested vehicles through a Telematics-BOX (T-BOX), a vehicle communication device.

Specifically, the current battery data can include charge-discharge status, single cell voltages, battery current, and state of charge (SOC). The charge-discharge status may be specifically a charging state or discharging state, representing the state of the battery in the to-be-tested vehicle. The single cell voltage may be the actual voltage corresponding to each single cell of the power battery in the to-be-tested vehicle. The battery current may be the actual current of the power battery in the to-be-tested vehicle. The state of charge may be the actual remaining capacity of the power battery in the to-be-tested vehicle.

In addition to charge-discharge status, single cell voltages, battery current, and state of charge, current battery data may also include real-time vehicle speed, location information, and other data.

S120: If the current battery data is determined to correspond to a charging condition based on the charge-discharge status, using the first warning model corresponding to the charging condition to extract target analysis data from the current battery data based on the state of charge at various time points in the current battery data: determining whether the cell inconsistency exists in the to-be-tested vehicle or not by a current mean voltage drop among the single cells corresponding to the target analysis data.

Specifically, based on the charge-discharge status in the current battery data, determining whether the current battery data for the to-be-tested vehicle corresponds to a charging condition or a discharging condition. For example, if the charge-discharge status is a charging state, the current battery data corresponds to a charging condition: if the charge-discharge status is a discharging state, the current battery data corresponds to a discharging condition.

If the current battery data corresponds to a charging condition, treat the current battery data as data corresponding to the current charging condition. Furthermore, using the first warning model to determine whether the to-be-tested vehicle has inconsistency in single cells. The first warning model may be used to identify the presence of inconsistency in single cells based on the current battery data under charging conditions.

In embodiments of the present disclosure, the first warning model may select a portion of the current battery data as target analysis data from the current battery data. For example, randomly select data from the current battery data at a preset number of time points as target analysis data.

In one specific embodiment, extracting target analysis data from the current battery data based on the state of charge at various time points in the current battery data includes: obtaining a first preset charge analysis range: based on the first preset charge analysis range selecting time points at which the state of charge is within the first preset charge analysis range in the current battery data; and constructing target analysis data based on the single cell voltages at the selected time points.

The first preset charge analysis range includes a SOC upper limit and a SOC lower limit. As an example, the first preset charge analysis range may be SOC in the range of 90-100. It should be noted that selecting SOC in the range of 90-100 as the first preset charge analysis range aims to enhance the detection of inconsistency in single cells when the battery is more prone to malfunction in the charging state within the SOC range of 90-100. This selection allows for efficient analysis while ensuring accuracy.

Specifically, time points where the state of charge is within the first preset charge analysis range may be filtered, and then the target analysis data based on the single cell voltages at the filtered time points is constructed.

Through the above embodiments, time points within the first preset charge analysis range may be selected from the current battery data for subsequent detection of inconsistency in single cells based on the voltages of single cells. This significantly improves analysis efficiency while ensuring accuracy.

Furthermore, the first warning model may determine the current mean voltage drop among the single cells based on the single cell voltages at various time points in the target analysis data. For example, determine the maximum voltage difference between single cells at each time point, and then use the maximum mean voltage drops at all time points as the current mean voltage drop. Furthermore, inconsistency in single cells may be detected based on the current mean voltage drops.

In a specific embodiment, the step, determining whether the cell inconsistency exists in the to-be-tested vehicle or not by the current mean voltage drop among the single cells corresponding to the target analysis data includes:

For each time point in the target analysis data, determining the maximum mean voltage drop between single cells based on the single cell voltages at the time point: determining the current mean voltage drop corresponding to the target analysis data based on the maximum mean voltage drop at each time point: determining whether the current mean voltage drop is greater than a first preset threshold. If so, confirming the presence of inconsistency in single cells of the to-be-tested vehicle under the current single charging condition, and generating a first warning signal and transmitting the first warning signal to an associated terminal corresponding to the to-be-tested vehicle.

As an example, the first warning model may determine the maximum mean voltage drop at each time point using the following formula:

$$\Delta U = U_{max\_v} - U_{min\_v};$$

Where, $U_{max\_v}$ is the maximum cell voltage at time point p, $U_{min\_v}$ is the minimum cell voltage at time point p, and $\Delta U_p$ is the maximum voltage drop at time point p. After obtaining the maximum voltage drop at each time point, the mean voltage drop across all time points may be further calculated using the formula:

$$U_{mean\_j} = \sum_{p=t_1}^{t_m} \Delta U_p / m$$

Where, $U_{mean\_j}$ is the current mean voltage drop at all time points: p refers the current time point, and $p=t_1, t_2, \ldots, t_m$; m represents the number of time points in the target analysis data.

Furthermore, the first warning model may assess whether the current mean voltage drop exceeds the first preset threshold. The first preset threshold is a predefined critical value used to determine cell inconsistency during the single charging condition, for example, 60 mV.

If the current mean voltage drop is greater than the first preset threshold, it indicates a significant voltage difference among single cells under the current charging condition, and there is inconsistency in the to-be-tested vehicle. Furthermore, the platform may generate a first warning signal and transmit the first warning signal to the associated terminal of the to-be-tested vehicle to alert the driver to move away from the vehicle promptly or replace the vehicle battery promptly.

The associated terminal may be a control screen of the vehicle or any user terminal linked to the vehicle, such as the user's smartphone, smartwatch, etc. The first warning signal may be in the form of text, voice, or a combination of text and voice, without limitation.

Through the above-described embodiments, real-time detection of cell inconsistency under the current single charging condition is achieved, ensuring detection accuracy.

In this embodiment, to further ensure the accuracy of cell inconsistency detection and avoid false positives caused by signal interference or other reasons during the single charging condition, continuous detection of cell inconsistency under the continuous charging conditions may also be implemented based on real-time battery data.

Figure 2:
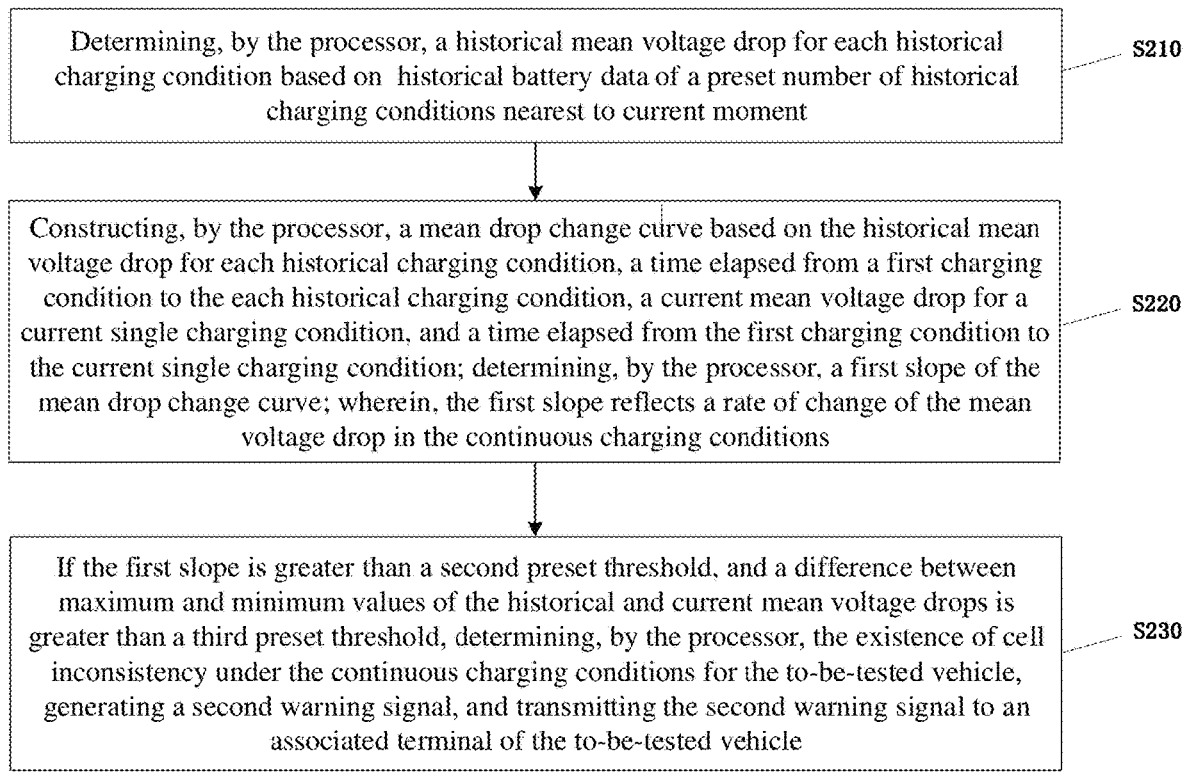
FIG. 2 is a flowchart of a method for determining whether the cell inconsistency exists in the to-be-tested vehicle by a current mean voltage drop among the single cells corresponding to the target analysis data.

Optionally, referring to FIG. 2, determining whether the cell inconsistency exists in the to-be-tested vehicle or not by the current mean voltage drop among the single cells corresponding to the target analysis data further includes: based on a historical battery data from the nearest preset number of historical charging conditions to the current moment determining, at step S210, a historical mean voltage drop among cells for each historical charging condition: based on the historical mean voltage drop, the time that each historical charging condition elapsed from the first charging condition, the current mean voltage drop under the current single charging condition, and the time elapsed from the first charging condition to the current single charging condition, constructing, at step S220, a mean drop change curve and determining a first slope corresponding to the mean drop change curve: if the first slope of the mean drop change curve is greater than a second preset threshold, and the difference between the maximum and minimum values of the historical and current mean voltage drops is greater than a third preset threshold, determining, at step S230, the existence of cell inconsistency under the continuous charging conditions for the to-be-tested vehicle, and generating a second warning signal and transmitting the second warning signal to the associated terminal of the to-be-tested vehicle.

Specifically, the first warning model can obtain the historical battery data for the to-be-tested vehicle from the nearest preset number of historical charging conditions at the current moment. Each historical charging condition may be a single charging condition. For instance, the historical data from the nearest N1 (e.g., 10) historical charging conditions may be obtained.

Furthermore, for each historical charging condition, the historical mean voltage drop among cells is determined based on the historical battery data for the charging condition. The determination method for the historical mean voltage drop may be similar to the method used for the current mean voltage drop.

Furthermore, the first warning model can plot points with the historical mean voltage drop of the historical charging conditions, the current mean voltage drop of the current single charging condition as a vertical axis, and the time that each historical charging condition elapsed from the first charging condition and the time elapsed from the first charging condition to the current single charging condition as a horizontal axis. Subsequently, a linear fit can be performed based on the plotted points to obtain the mean drop change curve. The horizontal axis of the mean drop change curve represents the time elapsed from the first charging condition, and the vertical axis represents the mean voltage drop. The mean drip curve can reflect the change in the mean voltage drops under continuous charging conditions.

As an example, the time elapsed from the first charging condition to the historical charging condition or the current single charging condition may be: $X_j = T_j - T_0$, where $T_j$ is the starting time of the j-th charging condition, $T_0$ is the starting time of the first charging condition, and $X_j$ is the time elapsed from the first charging condition to the j-th charging condition. It is to be noted that the first charging condition may be the first single charging condition obtained by the platform for the to-be-tested vehicle.

Additionally, the first warning model can determine the first slope of the mean drop change curve, where the first slope reflects the rate of change in the mean voltage drop over continuous charging conditions.

If the first slope of the curve exceeds the second preset threshold, and the difference between the maximum and minimum mean voltage drops among all historical and current values exceeds the third preset threshold, then the first warning model can determine the presence of cell inconsistency in the to-be-tested vehicle under the continuous charging conditions. At this point, the platform can generate the second warning signal and send the second warning signal to the associated terminal of the to-be-tested vehicle.

The second preset threshold may be a preset critical value used to detect the rate of change in mean voltage drops under continuous charging conditions, e.g., 0.05. The third preset threshold may be a preset critical value for the mean drops used to detect the cell inconsistency under continuous charging conditions, e.g., 40 mV.

Through the above embodiments, the detection of cell inconsistency is achieved under continuous charging conditions, further ensuring the accuracy of the cell inconsistency detection. This helps avoid the situation of false detection or missed detection of cell inconsistency under single charging conditions due to signal interference. Additionally, based on the trend of changes in continuous charging conditions, potential hazards of the vehicle may be identified earlier, ensuring vehicle safety.

S130: If the current battery data is determined to correspond to a discharging condition based on the charge-discharge status, using a second warning model corresponding to the discharging condition to extract target analysis data from the current battery data based on the battery current and state of charge at various time points: determining whether the cell inconsistency exists in the to-be-tested vehicle or not by a current voltage differential between single cells at adjacent time points corresponding to the target analysis data.

Specifically, if the current battery data corresponds to a discharging condition, consider the current battery data as data corresponding to the current discharging condition. Furthermore, the second warning model is used to assess whether there is inconsistency in single cells in the to-be-tested vehicle. The second warning model may be used to identify the presence of inconsistency in single cells under the discharging condition.

In this embodiment, the second warning model can initially select a portion of data from the current battery data as target analysis data to determine the presence of inconsistency in single cells. For example, randomly select data at a preset number of time points from the current battery data as target analysis data.

In a specific embodiment, extracting target analysis data from the current battery data based on the battery current and state of charge at various time points includes: obtaining a second preset charge analysis range and a preset current analysis range for current analysis: selecting time points where the state of charge is within the second preset charge analysis range and the battery current is within the preset current analysis range; and constructing the target analysis data based on the voltages of single cells at the selected time points.

The second preset charge analysis range can include a SOC upper limit and a SOC lower limit. For example, the second range for analyzing charge may be SOC in the range of 0-10. The current analysis range can include a battery current upper limit and a battery current lower limit. For example, the current analysis range may be battery current in the range of 0-5.

It should be noted that the purpose of selecting SOC in the range of 0-10 as the second preset charge analysis range and selecting battery current in the range of 0-5 as the current analysis range is because the inconsistency of single cells is more evident in data from low current and low SOC time ranges under discharging conditions. Therefore, selecting data from this range for inconsistency analysis ensures accuracy and significantly improves analysis efficiency.

Specifically, select time points where the state of charge is within the second preset charge analysis range and the battery current is within the current analysis range. Subsequently, based on the voltages of single cells at the selected time points, the target analysis data is constructed.

Through the above embodiments, various time points within the second preset charge analysis range and the preset current analysis range may be selected from the current battery data. This facilitates the subsequent detection of cell inconsistency based on the voltages of the selected time points. This not only ensures analytical accuracy but also significantly improves efficiency.

Furthermore, the second warning model can determine the voltage differential between each single cell at adjacent time points based on the voltages of each single cell at various time points in the target analysis data. Subsequently, the inconsistency in single cells may be detected based on these voltage differentials. For example:

$$\Delta U_{lp} = U_{t_{(l+1)}q} - U_{t_{(l)}q}, l = 1, 2, 3 \ldots n-1$$

Where, $\Delta U_{lp}$ represents the current voltage differential for the q-th cell between time point l and time point l+1; q=1, 2, ... Q, where Q represents the total number of the cells in the to-be-tested vehicle: $U_{t_{(l+1)}q}$ is the voltage of the q-th cell at time point l+1, and $U_{t_{(l)}q}$ is the voltage of the q-th cell at time point l.

In a specific embodiment, determining whether the cell inconsistency exists in the to-be-tested vehicle or not by a current voltage differential between single cells at adjacent time points corresponding to the target analysis data includes the following steps.

For each single cell, based on the single cell voltages at various time points corresponding to the target analysis data, determining the current voltage differentials between the single cells at adjacent time points. Based on each of the current voltage differentials, determining a current voltage coefficient of variation (CV) for each cell. Determining a current maximum CV and a current maximum CV difference among all cells based on the current voltage CV of each cell. If the current maximum CV is greater than a fourth preset threshold and the current maximum CV difference is greater than a fifth preset threshold, determining the presence of inconsistency in single cells in the to-be-tested vehicle under the current single discharging condition, and generating and transmitting the first warning signal and to the associated terminal of the to-be-tested vehicle.

Specifically, for each single cell, the second warning model can calculate the current voltage CV based on all the current voltage differentials for the cells. The current voltage CV describes the fluctuation level of the single cell voltage under the current discharging condition.

Optionally, determining the current voltage CV for each cell based on the various current voltage differentials includes: determining a mean voltage differential of each current voltage differential: determining a voltage differential standard deviation based on each current voltage differential and the mean voltage differential; and determining the current voltage CV for each cell based on the mean voltage differential and the voltage differential standard deviation.

Specifically, for an single cell, the average value of the current voltage differentials, i.e., the mean voltage differential, may be calculated based on all the current voltage differentials for the cells, as follows:

$$\mu_q = \frac{\sum_{l=1}^{n-1} \Delta U_{lq}}{n-1}$$

Where, $\mu_q$ is the mean voltage differential for the q-th cell, and n represents the number of the time points in the target analysis.

Furthermore, based on all the current voltage differentials and the mean voltage differential for the single cells, the voltage differential standard deviation for the cells is calculated. For example:

$$\sigma_q = \frac{\sqrt{\sum_{i=1}^{n-1}(\Delta U_{iq} - \mu_q)^2}}{n-1}$$

Where, $\sigma_q$ is the voltage differential standard deviation for the q-th cell.

Furthermore, the second warning model can determine the current voltage CV for the cells based on the mean voltage differential and the voltage differential standard deviation, as follows:

$$\delta_q = \frac{\sigma_q}{\mu_q}$$

Where, $\delta_a$ is the current voltage CV for the q-th cell.

In the above embodiments, accurately describing the fluctuation level of single cells in the current discharging condition is achieved by calculating the mean voltage differential of all current voltage differentials for each single cell, followed by calculating the voltage differential standard deviation using the mean voltage differential and all current voltage differentials, and determining the current voltage CV for the single cells using the mean voltage differential and the voltage differential standard deviation. This facilitates the detection of cell inconsistency based on the current voltage CV, ensuring detection accuracy.

After obtaining the current voltage CV for all cells, the second warning model can identify the current maximum voltage CV as the current maximum CV, and determine the difference between the current maximum and current minimum voltage CVs as a current maximum CV difference.

Furthermore, the second warning model can assess whether the current maximum CV exceeds the fourth preset threshold, and whether the current maximum CV difference is greater than the fifth preset threshold. If both conditions are met, it indicates the presence of cells with significant fluctuations, and the differences in fluctuation levels among single cells are substantial. This allows the determination that the to-be-tested vehicle exhibits cell inconsistency in the current single discharging condition, prompting the platform to send the first warning signal to the associated terminal.

The fourth preset threshold may be a predefined CV critical value for detecting inconsistency in single cells under single discharging condition, such as 0.1. The fifth preset threshold may be a predefined difference critical value in the single discharging condition, such as 0.1.

Through this approach, accurate detection of cell inconsistency in the current discharging condition is achieved based on real-time battery data, ensuring detection precision.

In this embodiment, to further ensure the accuracy of cell inconsistency detection and avoid data anomalies due to signal interference in a single discharging condition, continuous detection of cell inconsistency in multiple discharging conditions may be implemented based on real-time battery data.

Figure 3:
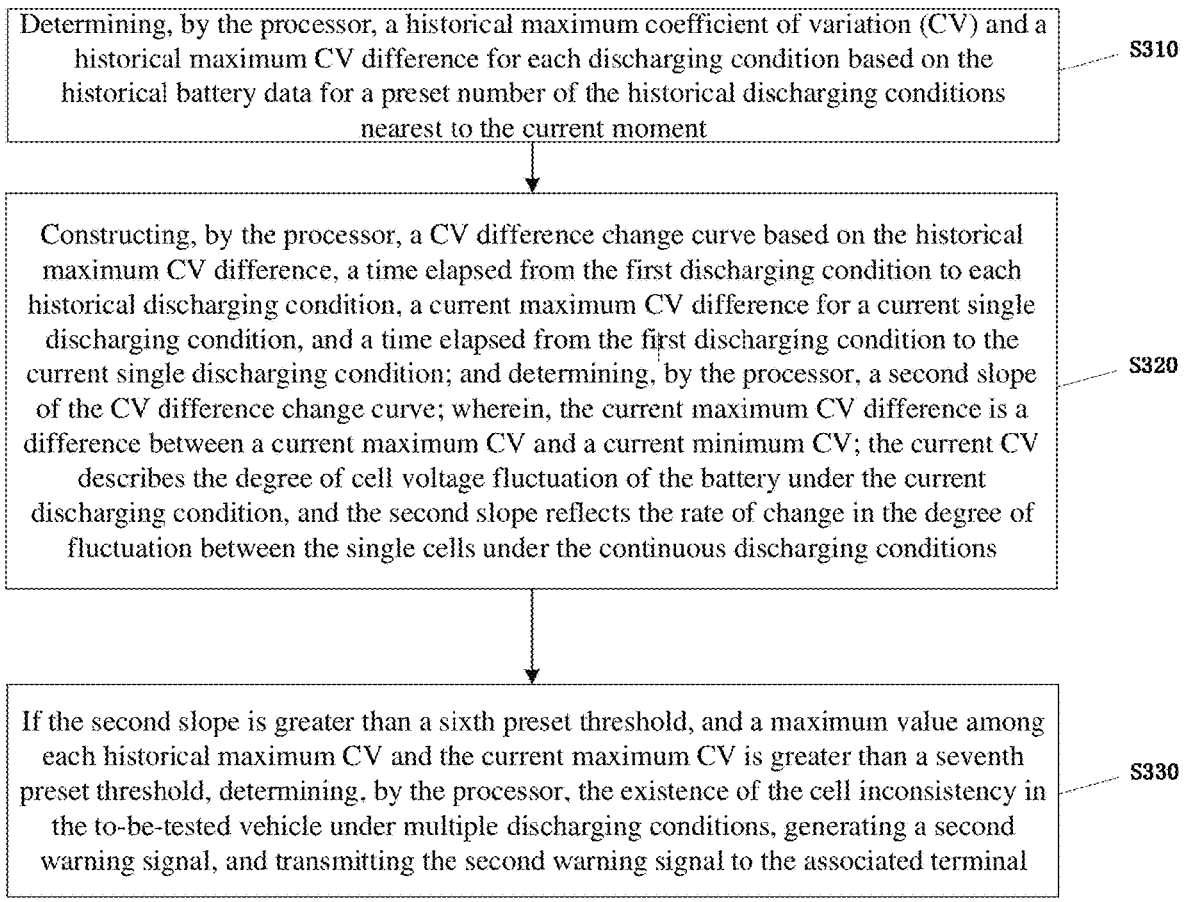
FIG. 3 is a flowchart of a method for whether the cell inconsistency exists in the to-be-tested vehicle by the current voltage differential between the single cells at the adjacent time points corresponding to the target analysis data.

Optionally, referring to FIG. 3, determining whether the cell inconsistency exists in the to-be-tested vehicle or not by a current voltage differential between single cells at adjacent time points corresponding to the target analysis data further includes:

Based on historical battery data from the nearest preset number of historical discharging conditions to the current time, at step S310, determining a historical maximum CV and a historical maximum CV difference for each historical discharging condition. Based on the historical maximum CV difference of each historical discharging condition, the time elapsed from the first discharging condition to the each historical discharging conditions, the current maximum CV difference of the current single discharging condition, and the time elapsed from the first discharging condition to the current single discharging condition, constructing, at step S320, a CV difference change curve, and determining a second slope corresponding to the CV difference change curve. If the second slope is greater than a sixth preset threshold, and a maximum value among each historical maximum CV and the current maximum CV is greater than a seventh threshold, then confirming the presence of cell inconsistency in multiple discharging conditions, and generating and transmitting the second warning signal to the associated terminal of the to-be-tested vehicle.

Specifically, the second warning model can obtain the historical battery data for the to-be-tested vehicle from the discharging conditions nearest to the current moment. Each of the historical discharging conditions may be a single discharging condition. For example, obtaining the historical battery data for the N2 (e.g., 5) most recent discharging conditions nearest to the current moment.

Furthermore, for each historical discharging condition, the second warning model can determine the historical maximum CV and the historical maximum CV difference based on the historical battery data under the each discharging condition. The method for determining the historical maximum CV and the historical maximum CV difference can follow the approach used for determining the current maximum CV and the current maximum CV difference.

Furthermore, the second warning model can plot points with the historical maximum CV difference of each historical discharging condition, the current maximum CV difference of the current single discharging condition as a vertical axis, and the time elapsed from the first discharging condition to each historical discharging condition, and the time elapsed from the first discharging condition to the current single charging condition as a horizontal axis. Subsequently, a linear fit can be performed based on the plotted points to obtain the CV difference change curve. The horizontal axis of the CV difference change curve represents the time elapsed from the first discharging condition, and the vertical axis represents the maximum CV difference. The CV difference change curve can reflect the fluctuation level of the single cells under continuous discharging conditions.

Furthermore, the second warning model may determine the second slope corresponding to the CV difference change curve. The second slope may reflect the rate of change in fluctuation level of the single cells under continuous discharging conditions.

If the second slope is greater than the sixth preset threshold, and a maximum value of all historical maximum CV and the current maximum CV is greater than the seventh preset threshold, then at step S330, the second warning model may determine the existence of cell inconsistency in the to-be-tested vehicle under multiple discharging conditions. In such a case, the platform can generate the second warning signal and transmit the second warning signal to the associated terminal of the to-be-tested vehicle.

The sixth preset threshold may be a predefined CV difference critical value for detecting cell inconsistency under multiple discharging conditions, such as 0.001. The seventh preset threshold may be a predefined maximum CV critical value for detecting cell inconsistency under multiple discharging conditions, such as 0.05.

Through the above-described embodiments, detection of cell inconsistency in continuous discharging conditions is realized, further ensuring the accuracy of cell inconsistency detection. It prevents false detections or omissions of cell inconsistency that may occur due to signal interference or other reasons in single discharging conditions. Simultaneously, based on the changing trends of continuous discharging conditions, potential hazards in the vehicle may be detected earlier, ensuring vehicle safety.

It should be noted that in embodiments of this disclosure, the execution sequence of S120 and S130 is not restricted.

Additionally, in embodiments of the disclosure, before extracting target analysis data from the current battery data, data cleaning may be performed on the current battery data. For example, data points outside a predefined voltage range (e.g., 2-5V) or outside a predefined SOC range (e.g., 0-100) may be excluded. This approach eliminates abnormal data caused by vehicle hardware resource influences, improving the accuracy of detecting single cell inconsistency.

Moreover, during the process of extracting target analysis data from the current battery data, factors such as vehicle speed range may be considered to select target analysis data.

The method provided in embodiments of the disclosure divides the current battery data obtained by the platform, combines the characteristics of charging and discharging conditions, and proposes different warning models for different conditions. Compared to detection methods using a unified predictive approach in the prior art, the methods in the prior art employ a unified model and parameters. Processing data collected in both charging and discharging conditions can result in errors in the model calculation, leading to false alarms. In contrast, the method provided in embodiments of the present disclosure proposes different battery inconsistency warning models for two conditions. In the charging condition, the vehicle state is relatively stable, and inconsistency is identified by the difference between the maximum and minimum voltages and their further calculations. In the discharging condition, where the vehicle state fluctuates more dramatically, inconsistency is identified by the differences in the voltage fluctuations over time and their derived calculated values. This approach addresses issues with traditional methods.

Furthermore, considering the fluctuation of battery data in charging and discharging conditions, analyzing a portion of the data for inconsistency reduces the computational load of the warning model. Compared to detection methods in the prior art that analyze all data for different conditions, which have a large computational load, the method provided in embodiments of the present disclosure can reduce the computational load and improve detection efficiency.

In addition to detecting single cell conditions in single charging and discharging conditions, a strategy for detecting trends in multiple conditions is also implemented. Single-condition detection often results in false alarms due to occasional data anomalies, and delays in warnings may occur if the data exceeds a threshold. Multiple-condition detection avoids false alarms caused by data anomalies and, based on the changing trends of variables in multiple conditions, can detect potential hazards in the vehicle earlier, addressing the issue of delayed warnings in traditional methods based on a single charging or discharging result exceeding a threshold.

The method for detecting inconsistency in vehicle cells provided in embodiments of the present disclosure may be executed by hardware devices installed on new energy vehicles. The hardware device serves as an independent warning device to ensure driver safety. Alternatively, it may be executed by a safety warning cloud platform, which analyzes the results and provides feedback to the vehicle terminal or user terminal.

The present disclosure has the following advantages: obtaining current battery data for the to-be-tested vehicle, determining whether the current battery data corresponds to a charging condition based on the charge and discharge status in the current battery data. If it does, using the first warning model corresponding to the charging condition to extract target analysis data in the current battery data based on the battery charge status at each time point. Subsequently, the method determines whether there is inconsistency among single cells based on the mean voltage drop between the current cells corresponding to the target analysis data. If not, the method uses the second warning model corresponding to the discharging condition to extract target analysis data in the current battery data based on battery current and charge status at each time point, and determines whether there is inconsistency among single cells based on the voltage differential between the current cells at adjacent time points corresponding to the target analysis data. This allows for distinguishing between charging and discharging conditions, proposing different warning models for different conditions, achieving separate detection for charging and discharging conditions, improving the accuracy of battery inconsistency warnings, addressing the issue of low detection accuracy in the prior art. Furthermore, in charging and discharging conditions, only a portion of the current battery data is extracted as target analysis data for subsequent detection, reducing the required data volume, thereby reducing the computational load during detection and improving efficiency, addressing the problem of high computational load in existing technologies.

Figure 4:
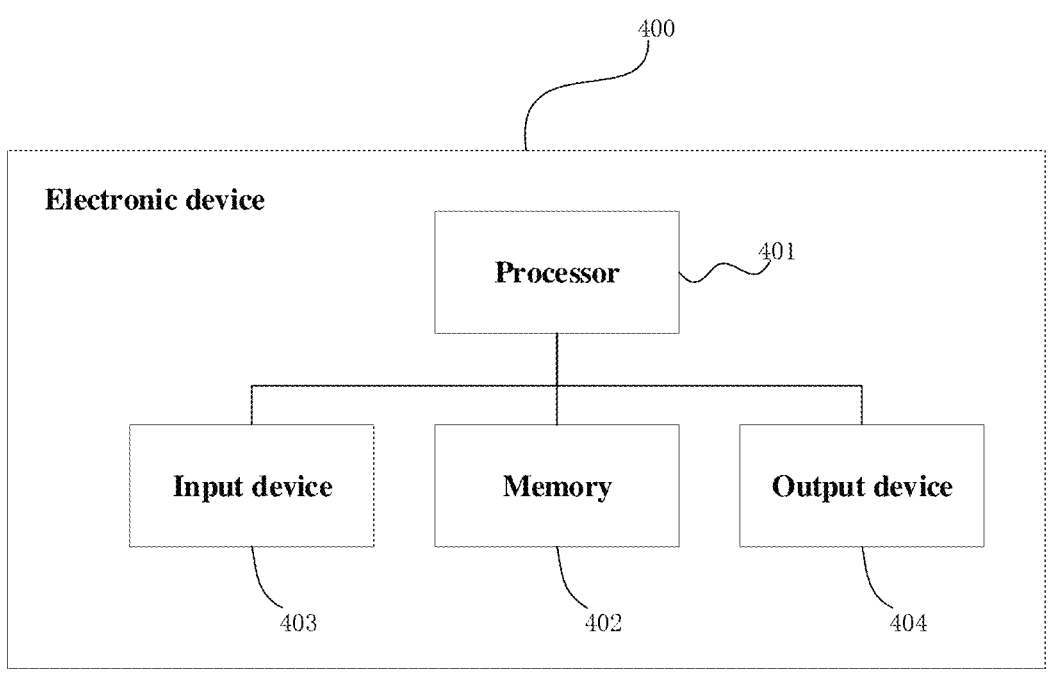
FIG. 4 is a schematic diagram of an electronic device according to embodiments of the present disclosure.

FIG. 4 is a schematic diagram of an electronic device according to embodiments of the present disclosure. As shown in FIG. 4, the electronic device 400 includes one or more processors 401 and a memory 402.

The processor 401 may be a central processing unit (CPU) or another form of processing unit with data processing and/or instruction execution capabilities. It can control other components in the electronic device 400 to perform desired functions.

The memory 402 may include one or more computer program products, which can include various forms of computer-readable storage media, such as volatile memory and/or non-volatile memory. Volatile memory, for example, may include random access memory (RAM) and/or cache. Non-volatile memory, for example, may include read-only memory (ROM), hard drives, flash memory, and the like. The memory 402 can store one or more computer program instructions, and the processor 401 can run the program instructions to implement the methods for detecting inconsistency in vehicle cells provided in any embodiment of the present disclosure and/or other desired functions. The memory 402 may also store various contents, such as initial external parameters, thresholds, and the like.

In one example, the electronic device 400 may further include: an input device 403 and an output device 404, which are interconnected through a bus system and/or other forms of connection mechanisms (not shown). The input device 403 may include, for example, a keyboard, mouse, and the like. The output device 404 can output various information to the outside, including warning messages, braking intensity, and the like. The output device 404 may include, for example, a display, speaker, printer, communication network, and its connected remote output device, and the like.

Of course, for the sake of simplicity, only some of the components related to the present disclosure in the electronic device 400 are shown in FIG. 4, and components such as buses and input/output interfaces are omitted. In addition, depending on the specific application, the electronic device 400 may include any other appropriate components.

In addition to the above methods and devices, embodiments of the present disclosure may also be computer program products comprising computer program instructions that, when executed by a processor, cause the processor to perform the steps of any embodiment of the method for detecting inconsistency in vehicle cells according to the present disclosure.

The computer program product may be written in one or more programming languages, including object-oriented programming languages such as Java, C++, and the like, and conventional procedural programming languages such as "C." The program code may be executed entirely on a user computing device, partially on a user device, as a standalone software package, partially on a user computing device and partially on a remote computing device, or entirely on a remote computing device or server.

Furthermore, embodiments of the present disclosure may also be computer-readable storage media containing computer program instructions that, when executed by a processor, cause the processor to perform the steps of any embodiment of the method for detecting inconsistency in vehicle cells provided in the present disclosure.

The computer-readable storage medium may include one or more combinations of readable media. The readable medium may be a readable signal medium or a readable storage medium. Readable storage media may include volatile and/or non-volatile media, such as RAM, ROM, electrically erasable programmable read-only memory (EEPROM) or flash memory, or any combination thereof. Specific examples of computer-readable storage media (non-exhaustive list) include: systems, devices, or apparatuses with one or more conductors, portable disks, hard disks, random access memory (RAM), read-only memory (ROM), erasable programmable read-only memory (EPROM or flash memory), optical fibers, portable compact disc read-only memory (CD-ROM), optical storage devices, and magnetic storage devices or any combination thereof.

It should be noted that the terms used in the present disclosure are for describing specific embodiments and are not intended to limit the scope of this application. As shown in the present disclosure specification, unless explicitly indicated otherwise in context, words such as "one," "an," "a," and/or "the" are not restricted to singular forms and may include plural forms. The terms "comprise," "contain," or any other variants are intended to cover non-exclusive inclusion, allowing processes, methods, or devices to include a series of elements not only explicitly listed but also those not explicitly listed or inherent to such processes, methods, or devices. When the statement "comprising a . . . " limits an element, it does not exclude other identical elements in processes, methods, or devices that include the specified element unless otherwise specified.

Additionally, terms such as "center," "up," "down," "left," "right," "vertical," "horizontal," "inner," "outer," etc., indicating orientation or positional relationships, are based on the orientation or positional relationships shown in the drawings for ease of describing the present disclosure and simplifying the description. They do not indicate or imply that the device or element referred to must have a specific orientation, be constructed, or operated in a specific orientation. Therefore, they should not be understood as limiting the present disclosure unless explicitly specified and limited. Terms such as "install," "connect," "link," etc., should be broadly understood. For example, they may be fixed connections, detachable connections, or integral connections: they may be mechanical connections or electrical connections: they may be directly connected or indirectly connected through an intermediate medium, and they may be connections within two components. Ordinary skilled artisans in the field can understand the specific meanings of these terms in the present disclosure based on specific situations.

Finally, it should be noted that the above embodiments are only used to illustrate the technical solutions of the present disclosure and are not intended to limit them. Although detailed descriptions of various embodiments have been provided, those skilled in the art should understand that modifications may be made to the technical solutions described in the embodiments, or some or all of the technical features may be equivalently replaced. These modifications or replacements do not depart from the essence of the technical solutions of various embodiments of the present disclosure.

What is claimed is:

1. A method for detecting inconsistency of single cells in a vehicle battery, comprising:

obtaining, by a processor, current battery data for a to-be-tested vehicle, wherein the current battery data comprises charge-discharge status, single cell voltages, battery current, and state of charge (SOC);

if the current battery data is determined to correspond to a charging condition based on the charge-discharge status, extracting, by the processor, target analysis data from the current battery data based on the SOC at various time points, by using a first warning model associated with the charging condition; determining, by the processor, whether cell inconsistency exists in the to-be-tested vehicle by a current mean voltage drop among the single cells corresponding to the target analysis data; and if the current battery data is determined to correspond to a discharging condition based on the charge-discharge status, extracting, by the processor, the target analysis data from the current battery data based on the battery current and the SOC at various time points by using a second warning model associated with the discharging condition; determining, by the processor, whether the cell inconsistency exists in the to-be-tested vehicle by a current voltage differential between single cells at adjacent time points corresponding to the target analysis data;

wherein, determining whether the cell inconsistency exists in the to-be-tested vehicle by a current mean voltage drop among the single cells corresponding to the target analysis data comprises:

determining, by the processor, a historical mean voltage drop for each historical charging condition based on historical battery data of a preset number of historical charging conditions nearest to current moment;

constructing, by the processor, a mean drop change curve based on the historical mean voltage drop for each historical charging condition, a time elapsed from a first charging condition to the each historical charging condition, a current mean voltage drop for a current single charging condition, and a time elapsed from the first charging condition to the current single charging condition; determining, by the processor, a first slope of the mean drop change curve; wherein, the first slope reflects a rate of change of the mean voltage drop in the continuous charging conditions;

if the first slope is greater than a second preset threshold, and a difference between maximum and minimum values of the historical and current mean voltage drops is greater than a third preset threshold, determining, by the processor, the existence of cell inconsistency under the continuous charging conditions for the to-be-tested vehicle, generating a second warning signal, and transmitting the second warning signal to an associated terminal of the to-be-tested vehicle;

wherein, determining whether the cell inconsistency exists in the to-be-tested vehicle by the current voltage differential between the single cells at the adjacent time points corresponding to the target analysis data comprises:

determining, by the processor, a historical maximum coefficient of variation (CV) and a historical maximum CV difference for each discharging condition based on the historical battery data for a preset number of the historical discharging conditions nearest to the current moment;

constructing, by the processor, a CV difference change curve based on the historical maximum CV difference, a time elapsed from the first discharging condition to each historical discharging condition, a current maximum CV difference for a current single discharging condition, and a time elapsed from the first discharging condition to the current single discharging condition; and determining, by the processor, a second slope of the CV difference change curve; wherein, the current maximum CV difference is a difference between a current maximum CV and a current minimum CV; the current CV describes the degree of cell voltage fluctuation of the battery under the current discharging condition, and the second slope reflects the rate of change in the degree of fluctuation between the single cells under the continuous discharging conditions;

if the second slope is greater than a sixth preset threshold, and a maximum value among each historical maximum CV and the current maximum CV is greater than a seventh preset threshold, determining, by the processor, the existence of the cell inconsistency in the to-be-tested vehicle under multiple discharging conditions, generating a second warning signal, and transmitting the second warning signal to the associated terminal.

2. The method according to claim 1, wherein, extracting the target analysis data based on the SOC at various time points in the current battery data comprises:
obtaining a first preset charge analysis range;
based on the first preset charge analysis range, selecting time points at which the SOC is within the first preset charge analysis range in the current battery data; and
constructing the target analysis data based on the cell voltages at the selected time points.

3. The method according to claim 1, wherein, extracting the target analysis data based on battery current and the SOC at various time points in the current battery data comprises:
obtaining a second preset charge analysis range and a preset current analysis range for current analysis;
based on the second preset charge analysis range and the preset current analysis range, selecting time points at which the SOC is within the second preset charge analysis range and the battery current is within the preset current analysis range; and
constructing the target analysis data based on the cell voltages at the selected time points.

4. The method according to claim 2, wherein, determining whether the cell inconsistency exists in the to-be-tested vehicle by a current mean voltage drop among the single cells corresponding to the target analysis data further comprises:
for each time point in the target analysis data, determining the maximum mean voltage drop between single cells based on the cell voltages at the time point;
determining the current mean voltage drop corresponding to the target analysis data based on the maximum mean voltage drop at each time point;
determining whether the current mean voltage drop is greater than a first preset threshold; and
if yes, confirming the presence of inconsistency in single cells of the to-be-tested vehicle under the current single charging condition, generating the first warning signal, and transmitting the first warning signal to the associated terminal corresponding to the to-be-tested vehicle.

5. The method according to claim 3, wherein, determining whether the cell inconsistency exists in the to-be-tested vehicle by a current voltage differential between single cells at adjacent time points corresponding to the target analysis data further comprises:
for each single cell, based on the cell voltages at various time points corresponding to the target analysis data, determining the current voltage differentials between the single cells at adjacent time points;
based on each of the current voltage differentials, determining a current voltage coefficient of variation (CV) for each cell;
determining a current maximum CV and a current maximum CV difference among all cells based on the current voltage CV of each cell; and
if the current maximum CV is greater than a fourth preset threshold and the current maximum CV difference is greater than a fifth preset threshold, determining the presence of inconsistency in the single cells in the to-be-tested vehicle under the current single discharging condition, generating the first warning signal, and transmitting the first warning signal to the associated terminal of the to-be-tested vehicle.

6. The method according to claim 5, wherein determining the current voltage CV for each cell based on the various current voltage differentials comprises:
determining a mean voltage differential of each current voltage differential;
determining a voltage differential standard deviation based on each current voltage differential and the mean voltage differential; and
determining the current voltage CV for the single cell based on the mean voltage differential and the voltage differential standard deviation.

7. An electronic device, comprising:
a processor and a memory,
wherein the processor, by invoking a program or instruction stored in the memory, is configured to execute the steps of the method according to claim 1 for detecting inconsistency of single cells in a vehicle battery.

8. A non-transitory computer-readable storage medium, storing a program or instruction, wherein the program or instruction, when executed by a computer, causes the computer to perform the steps of the method according to claim 1 for detecting inconsistency of single cells in a vehicle battery.

\* \* \* \* \*